(12) United States Patent
Hosomi

(10) Patent No.: US 8,723,334 B2
(45) Date of Patent: May 13, 2014

(54) SEMICONDUCTOR DEVICE INCLUDING SEMICONDUCTOR PACKAGE

(71) Applicant: Kabushiki Kaisha Toshiba, Tokyo (JP)

(72) Inventor: Eiichi Hosomi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/830,778

(22) Filed: Mar. 14, 2013

(65) Prior Publication Data

US 2014/0027930 A1    Jan. 30, 2014

(30) Foreign Application Priority Data

Jul. 27, 2012    (JP) .................. 2012-166936

(51) Int. Cl.
*H01L 23/02*    (2006.01)
(52) U.S. Cl.
USPC ...................... 257/777; 257/686; 257/723
(58) Field of Classification Search
USPC ......................... 257/723, 686, 777
See application file for complete search history.

(56) References Cited

U.S. PATENT DOCUMENTS

| | | | |
|---|---|---|---|
| 6,521,881 B2 * | 2/2003 | Tu et al. | 250/208.1 |
| 6,642,610 B2 * | 11/2003 | Park et al. | 257/678 |
| 6,906,416 B2 | 6/2005 | Karnezos | |
| 7,239,164 B2 * | 7/2007 | Tamaki | 257/686 |
| 8,120,156 B2 * | 2/2012 | Camacho et al. | 257/686 |
| 8,349,651 B2 | 1/2013 | Lee et al. | |
| 2006/0027841 A1 | 2/2006 | Tamaki | |
| 2009/0108425 A1 | 4/2009 | Lee et al. | |

FOREIGN PATENT DOCUMENTS

| | | |
|---|---|---|
| JP | 2006-049569 A | 2/2006 |
| JP | 3842272 B2 | 11/2006 |
| JP | 2008-123341 A | 5/2008 |
| JP | 2009-111392 A | 5/2009 |

OTHER PUBLICATIONS

N. Motohashi et al., "SMAFTI Package with Planarized Multilayer Interconnects", 2009 Electronic Components and Technology Conference, pp. 599-606 (in English).

* cited by examiner

*Primary Examiner* — Roy K Potter
(74) *Attorney, Agent, or Firm* — Holtz, Holtz, Goodman + Chick, PC

(57) ABSTRACT

According to one embodiment, a semiconductor device includes a package substrate, a semiconductor package, a first semiconductor chip and a first bonding wire. The package substrate has a first pad on a first principal surface. The semiconductor package is mounted on the first principal surface of the package substrate. The semiconductor package contains a semiconductor chip and has a second pad. The first semiconductor chip is mounted on the semiconductor package. The first bonding wire is connected between the first pad and the second.

17 Claims, 6 Drawing Sheets

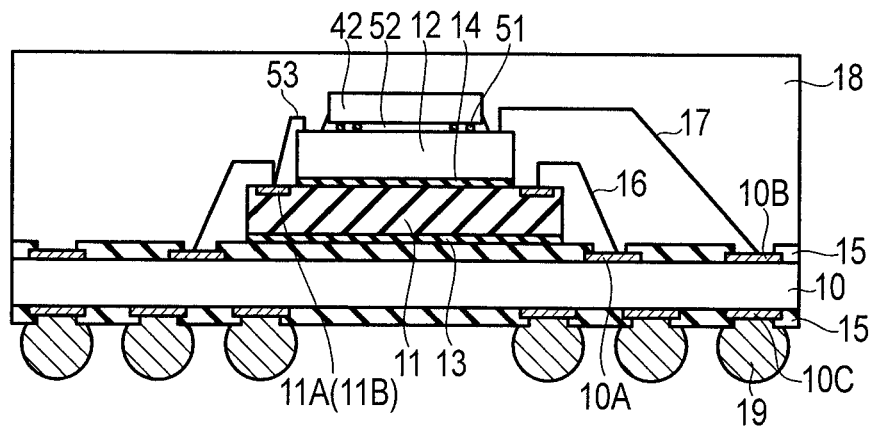
F I G. 12
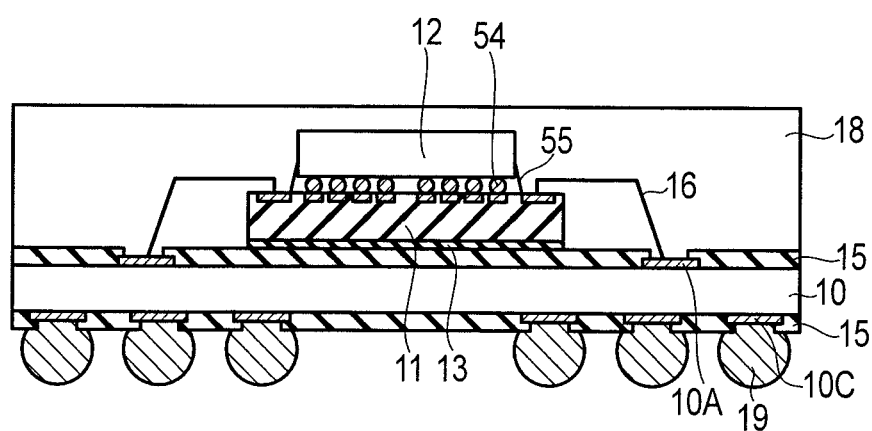
F I G. 13

SEMICONDUCTOR DEVICE INCLUDING SEMICONDUCTOR PACKAGE

CROSS-REFERENCE TO RELATED APPLICATIONS

This application is based upon and claims the benefit of priority from Japanese Patent Application No. 2012-166936, filed Jul. 27, 2012, the entire contents of which are incorporated herein by reference.

FIELD

Embodiments described herein relate generally to a semiconductor device including a semiconductor package having a semiconductor chip sealed inside the package.

BACKGROUND

A multi-chip package (MCP) sealing a plurality of semiconductor chips inside one package is widely used, particularly in mobile devices. Further, a package in package (PiP) in which a package is mounted inside a package is used in part of high-functionality semiconductors.

However, if such a PiP structure is made thinner, a deficiency such as an exposed wire and contact of a semiconductor chip with a semiconductor package may arise.

BRIEF DESCRIPTION OF THE DRAWINGS

FIG. 12 is a sectional view showing a structure of a semiconductor device according to a modification of the third embodiment; and FIG. 13 is a sectional view showing a structure of a semiconductor device according to a fourth embodiment.

DETAILED DESCRIPTION

Figure 1:
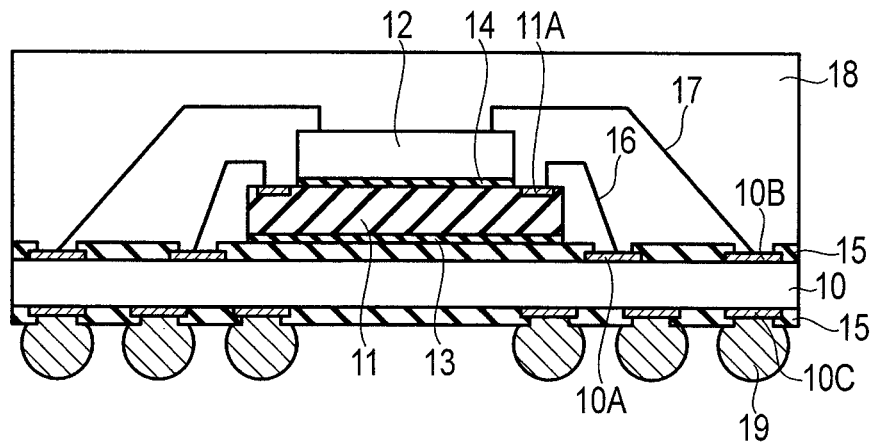
FIG. 1 is a sectional view showing a structure of a semiconductor device according to a first embodiment.

Semiconductor devices in the embodiments will be described below with reference to the drawings. In the description that follows, the same reference numerals are attached to structural elements having the same function and configuration and a duplicate description is provided only when necessary.

In general, according to one embodiment, a semiconductor device includes a package substrate, a semiconductor package, a first semiconductor chip and a first bonding wire. The package substrate has a first pad on a first principal surface. The semiconductor package is mounted on the first principal surface of the package substrate. The semiconductor package contains a semiconductor chip and has a second pad. The first semiconductor chip is mounted on the semiconductor package. The first bonding wire is connected between the first pad and the second pad.

[First Embodiment]

The first embodiment has a structure in which a semiconductor package having a semiconductor chip sealed in the package and a bare semiconductor chip are stacked.

FIG. 1 is a sectional view showing the structure of a semiconductor device according to the first embodiment.

As illustrated in FIG. 1, the semiconductor device includes a semiconductor package 11 and a semiconductor chip 12 stacked on a package substrate 10. The semiconductor package 11 is mounted on a first principal surface of the package substrate 10. Further, the semiconductor chip 12 is mounted on the semiconductor package 11.

An adhesive 13 is arranged between the package substrate 10 and the semiconductor package 11. The semiconductor package 11 is fixed onto the package substrate 10 by the adhesive 13. Further, an adhesive 14 is arranged between the semiconductor package 11 and the semiconductor chip 12. The semiconductor chip 12 is fixed onto the semiconductor package 11 by the adhesive 14.

The semiconductor package 11 contains one or a plurality of semiconductor chips. A semiconductor chip contained in the semiconductor package 11 includes, for example, a memory circuit (such as a DRAM and a NAND flash memory), a memory controller, a logic circuit, or an analog circuit. It is assumed here that the semiconductor package 11 contains a semiconductor chip having a memory circuit.

The semiconductor chip 12 includes, for example, a logic circuit, an analog circuit, a memory controller, or a memory circuit (such as a DRAM or a NAND flash memory). It is assumed here that the semiconductor chip 12 has a logic circuit.

Pads 10A, 10B and a solder resist 15 are formed on the first principal surface of the package substrate 10. The pads 10A, 10B are connected to wires formed on the first principal surface. The solder resist 15 covers a portion other than the pads 10A, 10B to insulate the package substrate 10.

A pad 11A is formed on the upper surface of the semiconductor package 11 and a pad (not shown) is formed on the upper surface of the semiconductor chip 12.

The pad 10A of the package substrate 10 and the pad 11A of the semiconductor package 11 are connected by a bonding wire 16. The pad 10B of the package substrate 10 and the pad of the semiconductor chip 12 are connected by a bonding wire 17. Further, a mold resin 18 is formed on the first principal surface of the package substrate 10. The mold resin 18 seals members arranged on the first principal surface of the package substrate 10. The mold resin 18 does not need to cover all the first principal surface of the package substrate 10. For example, the periphery of the package substrate 10 is not covered by the mold resin 18 and may be an exposed surface. That is, a portion of the first principal surface of the package substrate 10 may have an exposed surface.

A pad 100 and the solder resist 15 are formed on a second principal surface opposite to the first principal surface of the package substrate 10. The pad 100 is connected to wires formed on the second principal surface. The solder resist 15 covers a portion other than the pad 100 to insulate the package substrate 10. A solder ball 19 for external connection is formed on the pad 100.

The structure of the above semiconductor package 11 will be described in detail below.

Figure 2:
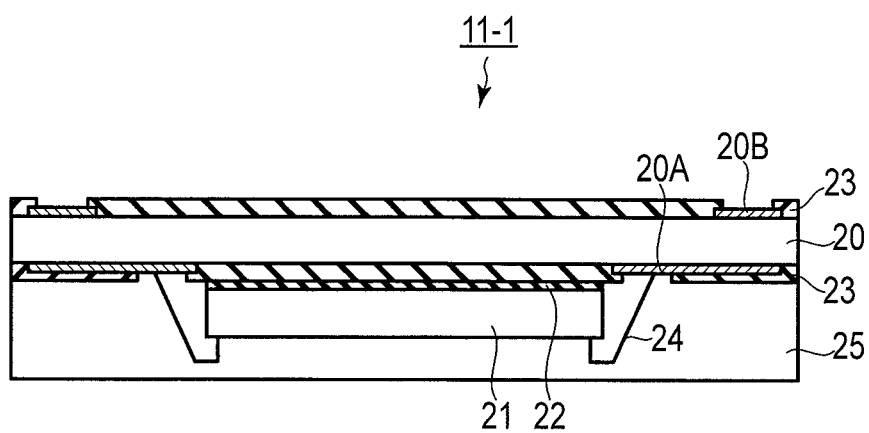
FIG. 2 is a sectional view of a first semiconductor package in the semiconductor device according to the first embodiment.
Figure 3:
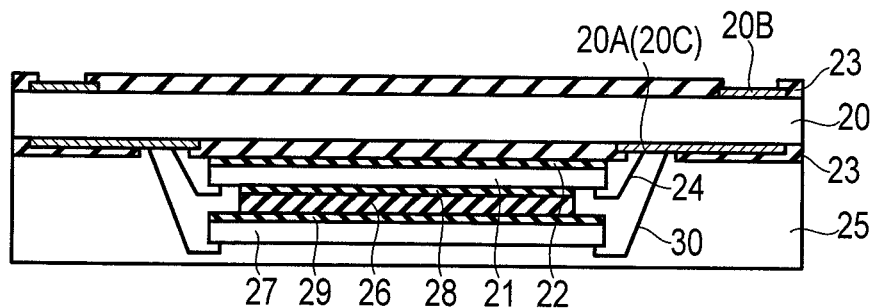
FIG. 3 is a sectional view of a second semiconductor package in the semiconductor device according to the first embodiment.
Figure 4:
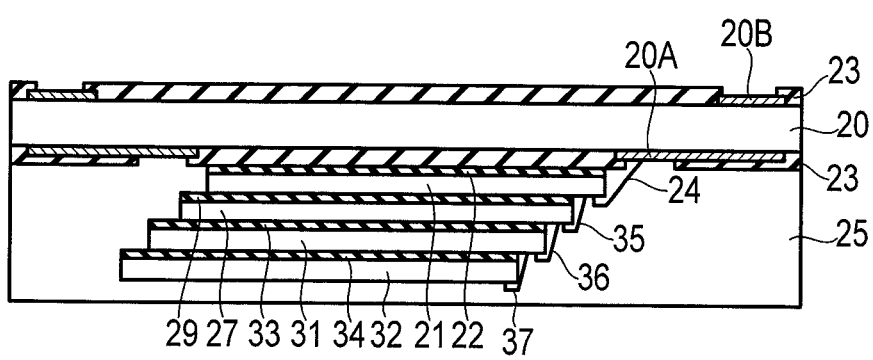
FIG. 4 is a sectional view of a third semiconductor package in the semiconductor device according to the first embodiment.

FIGS. 2 to 4 show configuration examples of the semiconductor package 11.

A semiconductor package 11-1 shown in FIG. 2 is an example having one semiconductor chip. A semiconductor chip 21 is mounted on a principal surface of a package substrate 20. An adhesive 22 is arranged between the package substrate 20 and the semiconductor chip 21. The semiconductor chip 21 is fixed to the principal surface of the package substrate 20 by the adhesive 22.

A pad 20A and a solder resist 23 are formed on the principal surface of the package substrate 20. The pad 20A is connected to wires formed on the principal surface of the package substrate 20. The solder resist 23 covers a portion other than the pad 20A to insulate the package substrate 20.

A pad (not shown) is formed on the upper surface of the semiconductor chip 21. The pad 20A of the package substrate 20 and the pad of the semiconductor chip 21 are connected by a bonding wire 24. Further, a mold resin 25 is formed on the principal surface of the package substrate 20. The mold resin 25 seals members arranged on the principal surface of the package substrate 20.

A pad 20B and the solder resist 23 are formed on a back surface opposite to the principal surface of the package substrate 20. The pad 20B is connected to wires formed on the back surface. The solder resist 23 covers a portion other than the pad 20B to insulate the package substrate 20.

A semiconductor package 11-2 shown in FIG. 3 is an example in which two semiconductor chips are stacked across a spacer. The semiconductor chip 21 is mounted on the principal surface of the package substrate 20. A spacer 26 is formed on the semiconductor chip 21. A semiconductor chip 27 is mounted on the spacer 26. The adhesive 22 is arranged between the package substrate 20 and the semiconductor chip 21. The semiconductor chip 21 is fixed to the principal surface of the package substrate 20 by the adhesive 22. An adhesive 28 is arranged between the semiconductor chip 21 and the spacer 26. The spacer 26 is fixed onto the semiconductor chip 21 by the adhesive 28. Further, an adhesive 29 is arranged between the spacer 26 and the semiconductor chip 27. The semiconductor chip 27 is fixed onto the spacer 26 by the adhesive 29.

A pad (not shown) is formed on the upper surface of the semiconductor chip 21. The pad 20A of the package substrate 20 and the pad of the semiconductor chip 21 are connected by the bonding wire 24. A pad (not shown) is formed on the upper surface of the semiconductor chip 27. A pad 20C of the package substrate 20 and the pad of the semiconductor chip 27 are connected by a bonding wire 30. Further, the mold resin 25 is formed on the principal surface of the package substrate 20. The mold resin 25 seals members arranged on the principal surface of the package substrate 20.

A semiconductor package 11-3 shown in FIG. 4 is an example in which four semiconductor chips are stacked. The semiconductor chip 21 is mounted on the principal surface of the package substrate 20. The semiconductor chip 27 is mounted on the semiconductor chip 21 and a semiconductor chip 31 is mounted on the semiconductor chip 27. Further, a semiconductor chip 32 is mounted on the semiconductor chip 31. The adhesive 22 is arranged between the package substrate 20 and the semiconductor chip 21. The semiconductor chip 21 is fixed to the principal surface of the package substrate 20 by the adhesive 22.

The adhesive 29 is arranged between the semiconductor chip 21 and the semiconductor chip 27. The semiconductor chip 27 is fixed onto the semiconductor chip 21 by the adhesive 29. An adhesive 33 is arranged between the semiconductor chip 31 and the semiconductor chip 27. The semiconductor chip 31 is fixed onto the semiconductor chip 27 by the adhesive 33. Further, an adhesive 34 is arranged between the semiconductor chip 32 and the semiconductor chip 31. The semiconductor chip 32 is fixed onto the semiconductor chip 31 by the adhesive 34.

Pads (not shown) are formed on the upper surfaces of the semiconductor chips 21, 27, 31, 32. The pad 20A of the package substrate 20 and the pad of the semiconductor chip 21 are connected by the bonding wire 24. The other pad of the semiconductor chip 21 and the pad of the semiconductor chip 27 are connected by a bonding wire 35. The other pad of the semiconductor chip 27 and the pad of the semiconductor chip 31 are connected by a bonding wire 36. Further, the other pad of the semiconductor chip 31 and the pad of the semiconductor chip 32 are connected by a bonding wire 37. Further, the mold resin 25 is formed on the principal surface of the package substrate 20. The mold resin 25 seals members arranged on the principal surface of the package substrate 20.

Next, the plane shape of a semiconductor device according to the first embodiment when viewed from above will be described.

Figure 5:
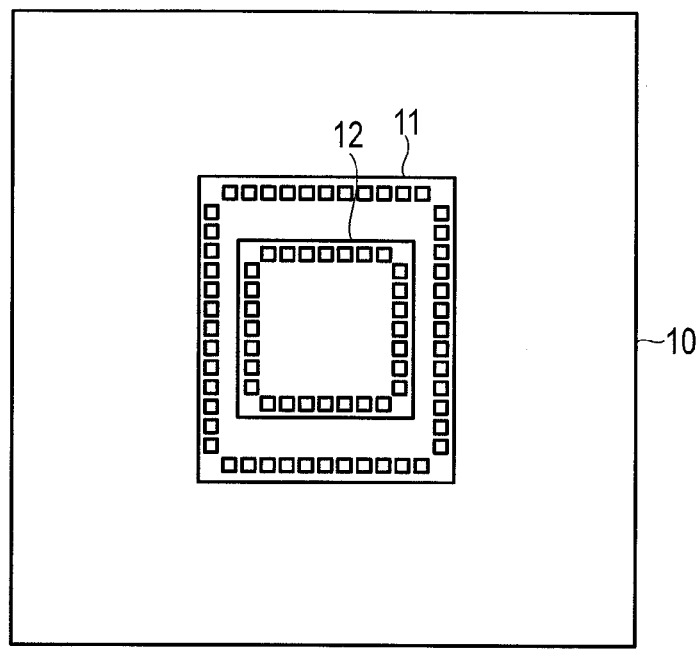
FIG. 5 is a plan view of the semiconductor device according to the first embodiment.
Figure 6:
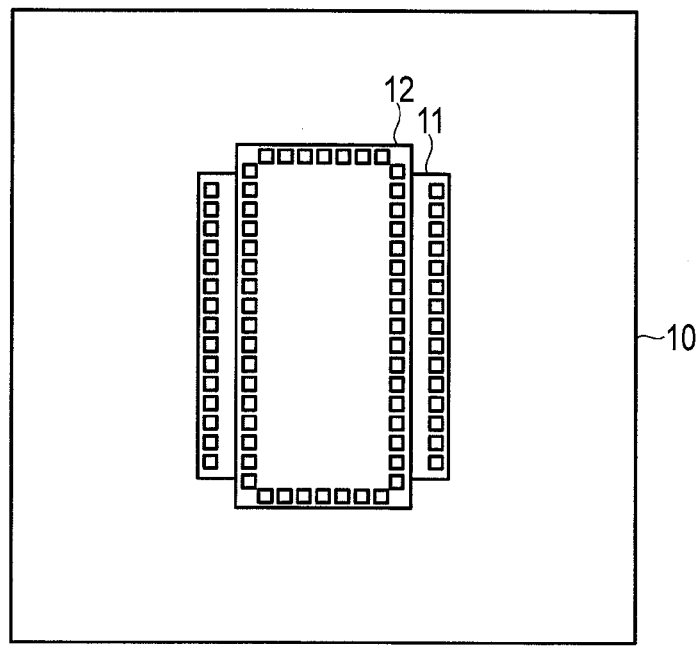
FIG. 6 is a plan view of another semiconductor device according to the first embodiment.

FIGS. 5 and 6 show top views of semiconductor devices according to the first embodiment. The mold resin and bonding wires are omitted.

The semiconductor device shown in FIG. 5 is an example in which an outside size of the semiconductor chip 12 is smaller than that of the semiconductor package 11.

The semiconductor device shown in FIG. 6 is an example in which the outside size in the longitudinal direction of the semiconductor chip 12 is larger than that of the semiconductor package 11. While the outside size in the width direction of the semiconductor chip 12 is smaller than that of the semiconductor package 11, the outside size in the longitudinal direction of the semiconductor chip 12 is longer than that of the semiconductor package 11. That is, the semiconductor device has a structure in which a portion of the external shape of the semiconductor chip 12 projects from the external shape of the semiconductor package 11 when viewed from above the package substrate 20. Even with such a structure, a semiconductor device having a package in package structure that can be made thinner can be realized.

Next, a semiconductor device according to a modification of the first embodiment will be described.

Figure 7:
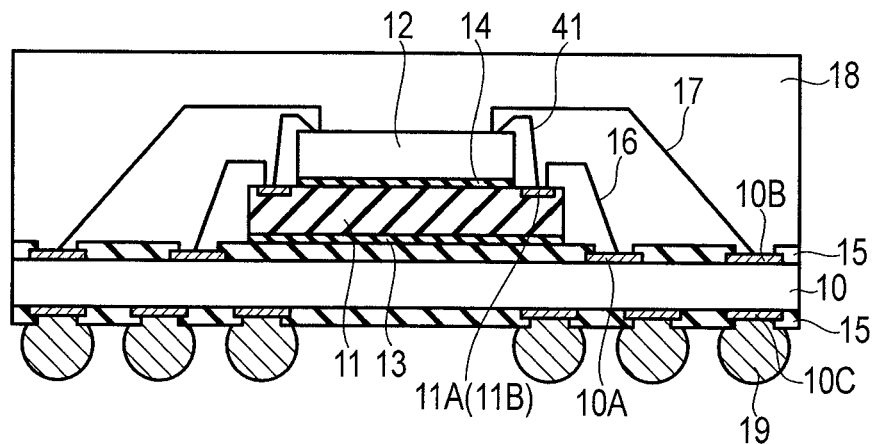
FIG. 7 is a sectional view showing the structure of a semiconductor device according to a modification of the first embodiment.

FIG. 7 is a sectional view showing the structure of a semiconductor device according to the modification of the first embodiment.

The modification of the first embodiment is added a bonding wire 41 to connect a semiconductor package 11 and a semiconductor chip 12 to the structure shown in FIG. 1. That is, a pad 11B of the semiconductor package 11 and a pad of the semiconductor chip 12 are connected by the bonding wire 41. Otherwise, the configuration is the same as that of the first embodiment shown in FIG. 1.

Figure 8:
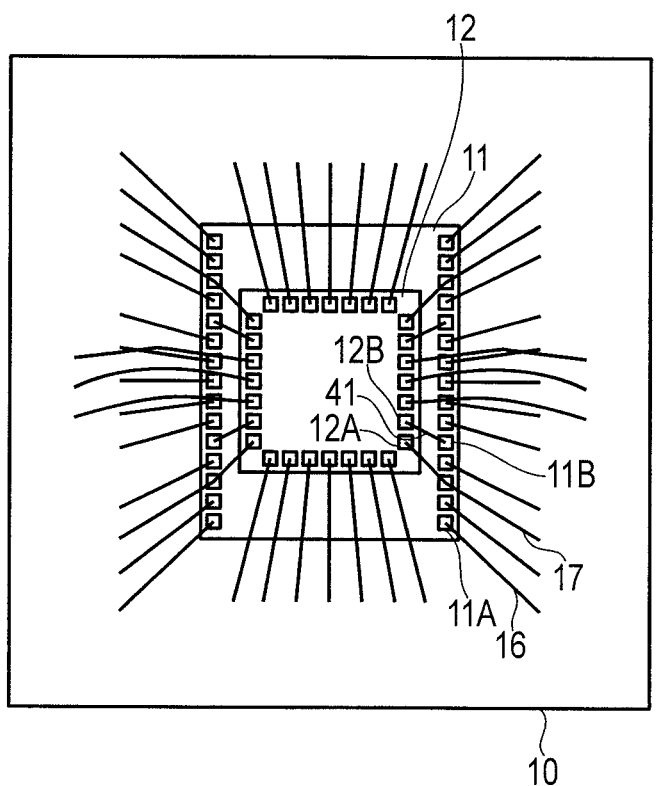
FIG. 8 is a plan view of the semiconductor device according to the modification of the first embodiment.

FIG. 8 is a top view of a semiconductor device according to the modification of the first embodiment.

As illustrated in FIG. 8, the semiconductor package 11 and the semiconductor chip 12 are stacked on a package substrate

10. A pad 11A arranged on the upper surface of the semiconductor package 11 and the package substrate 10 are connected by a bonding wire 16.

A pad 12A arranged on the upper surface of the semiconductor chip 12 and the package substrate 10 are connected by a bonding wire 17. Further, a pad 12B arranged on the upper surface of the semiconductor chip 12 and the pad 11B arranged on the upper surface of the semiconductor package 11 are connected by a bonding wire 41. In the first embodiment shown in FIG. 1, all wires joined to the semiconductor chip (logic chip) 12 containing a logic circuit and the semiconductor package (memory package) 11 containing a memory circuit are connected to the package substrate 10, but in the modifications, the logic chip and the memory package are directly connected by a wire. Accordingly, the wire length between the logic chip and the memory package can be made shorter so that electric characteristics of the semiconductor device can be improved. For example, if a high-speed memory is used for a memory package, electric characteristics of the high-speed memory can significantly be improved.

In the first embodiment and the modification thereof described above, the semiconductor device having a package in package structure containing the semiconductor chip and the semiconductor package can be made thinner.

If, for example, a package substrate and a semiconductor package mounted thereon are connected by bumps, the bumps are arranged between the package substrate and the semiconductor package and thus, the thickness of the semiconductor device becomes thick by the thickness of the bumps. In the present embodiment, by contrast, the package substrate and the semiconductor package are connected by the adhesive and thus, the thickness of the semiconductor device can be made thin rather than when connected by the bumps.

If, for example, a package substrate and a semiconductor package are connected by bumps, the bumps are arranged below the semiconductor package in an array form and thus, wires on the semiconductor package to which these bumps are connected form a fine pattern. Therefore, it is necessary to use a substrate on which a fine pattern can be formed, that is, a substrate on which a pattern of fine design rules can be formed as the package substrate. In the present embodiment, by contrast, the package substrate and the semiconductor package are connected by the bonding wire and thus, a substrate whose wiring density is sparser than when connected by the bumps can be used as the package substrate. Therefore, according to the present embodiment, the cost of the package substrate can be reduced more than when connected by the bumps.

Further, if a package substrate and a semiconductor package are connected by bumps, it is necessary to execute the processes in the order like bump printing, semiconductor package mounting, reflow, and flux washing, making the manufacturing process more complex. According to the present embodiment, on the other hand, only processes like mount material coating, semiconductor package mounting, and curing treatment are needed and thus, the manufacturing process can be made simpler than when connected by the bumps.

[Second Embodiment]

In the second embodiment, a semiconductor device in which a semiconductor package, a first semiconductor chip, and a second semiconductor chip are stacked on a package substrate will be described.

Figure 9:
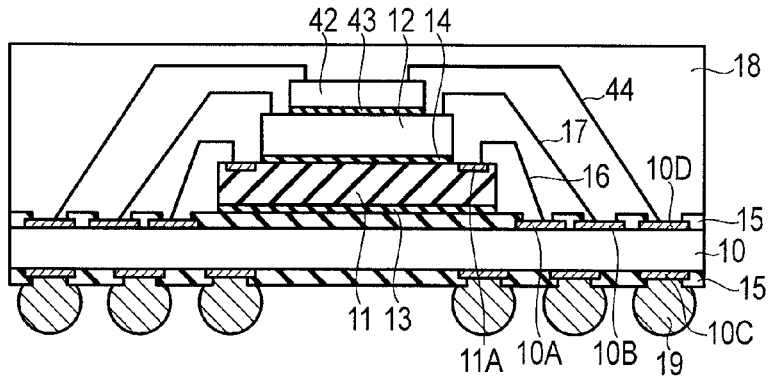
FIG. 9 is a sectional view showing a structure of a semiconductor device according to a second embodiment.

FIG. 9 is a sectional view showing the structure of a semiconductor device according to the second embodiment.

The semiconductor device further includes, in the structure shown in FIG. 1, a semiconductor chip 42 stacked on a semiconductor chip 12 and a bonding wire 44. That is, the semiconductor chip 42 is mounted on the semiconductor chip 12. An adhesive 43 is arranged between the semiconductor chip 12 and the semiconductor chip 42. The semiconductor chip 42 is fixed onto the semiconductor chip 12 by the adhesive 43. The semiconductor chip 42 includes, for example, a logic circuit, an analog circuit, a memory controller, or a memory circuit (such as a DRAM or a NAND flash memory).

A pad 10D of a package substrate 10 and a pad (not shown) of the semiconductor chip 42 are connected by a bonding wire 44. Otherwise, the configuration is the same as that of the first embodiment shown in FIG. 1.

Next, a semiconductor device according to a modification of the second embodiment will be described.

Figure 10:
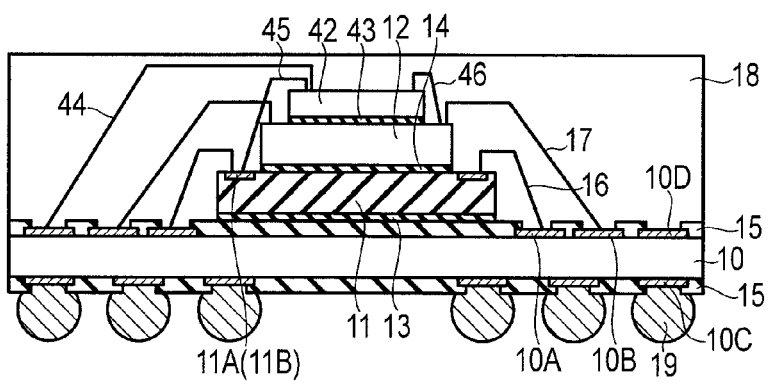
FIG. 10 is a sectional view showing a structure of a semiconductor device according to a modification of the second embodiment.

FIG. 10 is a sectional view showing the structure of the semiconductor device according to the modification of the second embodiment.

The semiconductor device further includes, in the structure shown in FIG. 9, bonding wires 45, 46. That is, a pad 11B of a semiconductor package 11 and a pad (not shown) of a semiconductor chip 42 are connected by a bonding wire 45. Further, a pad (not shown) of a semiconductor chip 12 and a pad (not shown) of the semiconductor chip 42 are connected by a bonding wire 46. Otherwise, the configuration and the effect are the same as those in the second embodiment shown in FIG. 9. The same effect as that of the modification of the first embodiment can be achieved.

[Third Embodiment]

In the third embodiment, a semiconductor device in which a semiconductor package, a first semiconductor chip, and a second semiconductor chip are stacked on a package substrate and the second semiconductor chip is connected to the first semiconductor chip by a flip chip bonding will be described.

Figure 11:
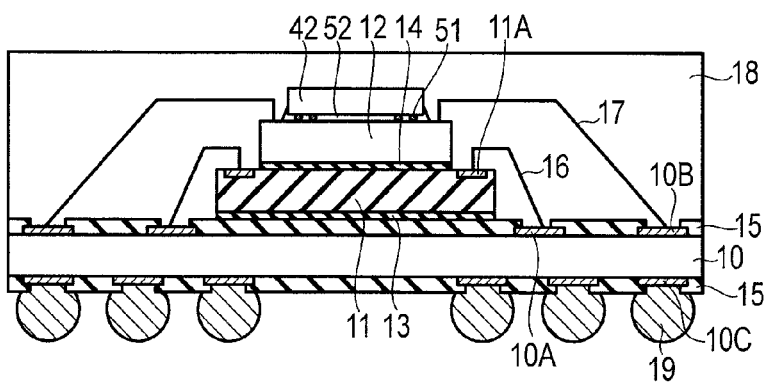
FIG. 11 is a sectional view showing a structure of a semiconductor device according to a third embodiment.

FIG. 11 is a sectional view showing the structure of a semiconductor device according to the third embodiment.

The semiconductor device further includes, in the structure shown in FIG. 1, a semiconductor chip 42 stacked on a semiconductor chip 12 and the semiconductor chip 42 is connected to the semiconductor chip 12 by flip chip bonding. A bump 51 is arranged between the semiconductor chip 12 and the semiconductor chip 42 and the semiconductor chip 42 is electrically connected to the semiconductor chip 12 by the bump 51. The semiconductor chip 42 includes, for example, a logic circuit, an analog circuit, a memory controller, or a memory circuit (such as a DRAM or a NAND flash memory).

Further, a protection resin 52 to protect the surface on which the bump 51 is formed is filled up between the semiconductor chip 12 and the semiconductor chip 42. Otherwise, the configuration and the effect are the same as those in the first embodiment shown in FIG. 1.

Next, a semiconductor device according to a modification of the third embodiment will be described.

FIG. 12 is a sectional view showing the structure of the semiconductor device according to the modification of the third embodiment.

The semiconductor device further includes, in the structure shown in FIG. 11, a bonding wire 53. That is, a pad 11B of a semiconductor package 11 and a pad (not shown) of a semiconductor chip 12 are connected by the bonding wire 53. Otherwise, the configuration and the effect are the same as those in the third embodiment shown in FIG. 11.

In the third embodiment and the modification thereof, the semiconductor device having a package in package structure containing the plurality of semiconductor chips and the semiconductor package can be made thinner.

If, for example, first and second semiconductor chips are mounted on a package substrate and a semiconductor package is mounted thereon, the distance between a wire connecting the semiconductor package and the package substrate and the surface of a mold resin is shortened, causing a problem when the semiconductor device (package) is made thinner. In the present embodiment, by contrast, a semiconductor package is mounted on a package substrate, first and second semiconductor chips are mounted thereon, and further the second semiconductor chip is connected to the first semiconductor chip by flip chip bonding. Thus, there is no need to bond a wire to the second semiconductor chip and a problem of the distance between the wire and the surface of the mold resin being shortened is not caused.

[Fourth Embodiment]

In the fourth embodiment, a semiconductor device in which a semiconductor package is arranged on a package substrate and a first semiconductor chip is connected to the semiconductor package by flip chip bonding will be described.

FIG. 13 is a sectional view showing the structure of a semiconductor device according to the fourth embodiment.

As illustrated in FIG. 13, the semiconductor device includes a semiconductor package 11 and a semiconductor chip 12 stacked on a package substrate 10. The semiconductor package 11 is mounted on a first principal surface of the package substrate 10. Further, the semiconductor chip 12 is mounted on the semiconductor package 11.

An adhesive 13 is arranged between the package substrate 10 and the semiconductor package 11. The semiconductor package 11 is fixed onto the package substrate 10 by the adhesive 13. Further, the semiconductor chip 12 is connected to the semiconductor package 11 by flip chip bonding. That is, a bump 54 is arranged between the semiconductor package 11 and the semiconductor chip 12 and the semiconductor chip 12 is electrically connected to the semiconductor package 11 by the bump 54.

Further, a protection resin 55 to protect the surface on which the bump 54 is formed is filled up between the semiconductor package 11 and the semiconductor chip 12. Otherwise, the configuration and the effect are the same as those in the first embodiment shown in FIG. 1.

In the fourth embodiment, the semiconductor device having a package in package structure containing the semiconductor chip and the semiconductor package can be made thinner.

If, for example, a semiconductor chip is connected to a package substrate by flip chip bonding and a semiconductor package is mounted thereon, the distance between a wire connecting the semiconductor package and the package substrate and the surface of a mold resin is shortened, causing a problem when the semiconductor device (package) is made thinner. In the present embodiment, by contrast, a semiconductor package is mounted on a package substrate and a semiconductor chip is connected thereto by flip chip bonding. Thus, there is no need to bond a wire to the semiconductor chip and a problem of the distance between the wire and the surface of the mold resin being shortened is not caused.

Because the substrate connected by flip chip bonding is required to be capable of a fine pattern, that is, a pattern of fine design rules, the cost of substrate tends to rise. In the present embodiment, a pattern of fine design rules is required from the semiconductor package 11 and so the cost of the semiconductor package 11 rises, but a pattern of normal design rules suffices for the package substrate 10 with a large outside size so that the cost of the package substrate 10 can be held down. The cost reduction of the package substrate 10 with a larger area has a larger cost reduction effect than the cost hike of the semiconductor package 11 with a smaller area so that the product cost as a whole semiconductor device can be reduced.

In the first to fourth embodiments, a semiconductor package may include one or a plurality of memory chips (semiconductor chip on which a memory circuit is formed) and the semiconductor chip may include a logic chip (semiconductor chip on which a logic circuit is formed), or a semiconductor package may include one or a plurality of logic chips and the semiconductor chip may include a memory chip.

According to the embodiments, as described above, a semiconductor device including a package structure that can be made thinner and contains a semiconductor chip and a semiconductor package can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first package substrate having a first pad on a first principal surface of the first package substrate;
a semiconductor package mounted on the first principal surface of the first package substrate, the semiconductor package containing a second package substrate and a first semiconductor chip mounted on a first principal surface of the second package substrate, and the second package substrate having a second pad on a second principal surface of the second package substrate opposite to the first principal surface of the second package substrate;
a second semiconductor chip mounted on the semiconductor package; and
a first bonding wire connected between the first pad and the second pad.

2. The semiconductor device according to claim 1, wherein the semiconductor package includes a plurality of the first semiconductor chips.

3. The semiconductor device according to claim 1, wherein the semiconductor package has a structure in which a plurality of the first semiconductor chips are stacked on the second package substrate.

4. The semiconductor device according to claim 1, wherein the second semiconductor chip has a third pad and the first package substrate has a fourth pad, and wherein the semiconductor device further includes a second bonding wire connected between the third pad and the fourth pad.

5. The semiconductor device according to claim 1, wherein the second semiconductor chip has a third pad and the semiconductor package has a fourth pad, and wherein the semiconductor device further includes a second bonding wire connected between the third pad and the fourth pad.

6. The semiconductor device according to claim 1, wherein the second semiconductor chip is connected to the semiconductor package by flip chip bonding.

7. The semiconductor device according to claim 1, wherein the semiconductor package is fixed onto the first package substrate by an adhesive.

8. The semiconductor device according to claim 1, wherein the second semiconductor chip has an outside size smaller than an outside size of the semiconductor package.

9. The semiconductor device according to claim 1, wherein an outside size in a longitudinal direction of the second semiconductor chip is longer than an outside size of the semiconductor package.

10. The semiconductor device according to claim 1, further comprising a third semiconductor chip mounted on the second semiconductor chip.

11. The semiconductor device according to claim 10, wherein the third semiconductor chip has a third pad and the first package substrate has a fourth pad, and wherein the semiconductor device further includes a second bonding wire connected between the third pad and the fourth pad.

12. The semiconductor device according to claim 10, wherein the third semiconductor chip has a third pad and the semiconductor package has a fourth pad, and wherein the semiconductor device further includes the a second bonding wire connected between the third pad and fourth pad.

13. The semiconductor device according to claim 10, wherein the third semiconductor chip has a third pad and the second semiconductor chip has a fourth pad, and wherein the semiconductor device further includes a second bonding wire connected between the third pad and the fourth pad.

14. The semiconductor device according to claim 10, wherein the third semiconductor chip is fixed onto the second semiconductor chip by an adhesive.

15. The semiconductor device according to claim 10, wherein the third semiconductor chip is connected to the second semiconductor chip by flip chip bonding.

16. The semiconductor device according to claim 15, wherein the second semiconductor chip has a third pad and the semiconductor package has a fourth pad, and wherein the semiconductor device further includes a second bonding wire connected between the third pad and the fourth pad.

17. The semiconductor device according to claim 1, further comprising an external connection terminal formed on a second principal surface of the first package substrate opposite to the first principal surface of the first package substrate.

\* \* \* \* \*